United States Patent [19]

Arumugham

[11] 4,005,256
[45] Jan. 25, 1977

[54] AFC CIRCUIT

[75] Inventor: Rangaswamy Arumugham, Batavia, N.Y.

[73] Assignee: GTE Sylvania Incorporated, Stamford, Conn.

[22] Filed: Nov. 3, 1975

[21] Appl. No.: 628,072

[52] U.S. Cl. .............................. 358/195; 325/418; 325/422; 325/464; 334/15
[51] Int. Cl.² ........................................ H04B 1/16
[58] Field of Search ................. 178/7.3 R, 5.8 AF; 325/418, 419, 420, 422, 459, 464, 465; 334/15

[56] References Cited

UNITED STATES PATENTS

| | | | |
|---|---|---|---|
| 3,828,257 | 8/1974 | Puskas | 325/418 |
| 3,914,696 | 10/1975 | Evans | 325/422 |
| 3,947,772 | 3/1976 | Sato | 325/422 |
| 3,952,143 | 4/1976 | Siwko | 178/5.8 AF |

Primary Examiner—Robert L. Richardson
Attorney, Agent, or Firm—Norman J. O'Malley; Robert E. Walrath; Robert T. Orner

[57] ABSTRACT

A signal combining circuit for combining a tuning bias voltage and an automatic frequency control error voltage for application to a voltage controlled radio frequency tuning means for a television receiver is shown. The voltage controlled radio frequency tuning means has a non-linear frequency versus voltage characteristic and the signal combining circuit includes a resistance means for coupling the error voltage to the tuning means input in a manner that compensates for the non-linearity of the frequency versus voltage characteristic of the tuning means to provide a substantially constant automatic frequency control pull-in range throughout the frequency range of interest.

6 Claims, 5 Drawing Figures

AFC CIRCUIT

CROSS-REFERENCE TO RELATED APPLICATION

K. Siwko, "Wide Band AFC System," Ser. No. 563,578, Filed Mar. 31, 1975, now U.S. Pat. No. 3,952,143 and assigned to the same assignee as this application.

FIELD OF THE INVENTION

This invention relates to automatic frequency control for voltage controlled radio frequency tuning means in television receivers and more particularly to signal combining circuits for combining a tuning voltage with an automatic frequency control voltage.

BACKGROUND OF THE INVENTION

In tuning systems of the type used in television receivers utilizing voltage controlled reactive elements as frequency determining components, the frequency of operation is typically determined by a variable bias voltage provided by, for example, a potentiometer. Typically, a plurality of potentiometers are provided with each potentiometer being set to provide the proper bias voltage for a respective channel. The voltage controlled frequency determining element or elements are typcially diodes with voltage controllable capacitances such as varactor diodes. For reasons of economy it is generally desired to utilize a single diode or circuit arrangement for all of the frequencies in which received signals are expected. In the case of a VHF tuner received signals can be expected in any of channels 2–13, however, band-switching circuitry can be used to divide the operation between low-band and high-band VHF channels. In the case of a UHF tuner received signals can be expected in any of channels 14–83, and accordingly, the frequency of operation of the tuner must be variable over the entire UHF band which includes video carrier frequencies from 471.25 MHz to 885.25 MHz.

Typical tuners using varactor-type diodes require a substantial range of capacitance change of the varactor diode to cover the frequency range of interest. The capacitance characteristic of typical varactor diodes, however, is not linear with respect to the applied bias voltage. While this problem is not unduly limiting with respect to the applied tuning bias voltage, the automatic frequency control (AFC) of the tuner is deleteriously affected. The AFC circuit provides a given correction voltage for a given frequency deviation from the proper intermediate frequency. Since the varactor diode capacitance characteristic is non-linear, however a given AFC correction voltage provides a differing amount of correction depending upon the bias voltage or channel received. For example, if the proper pull-in range is provided at the low frequency channels in the band of interest, the pull-in range at the high frequency channels becomes insufficient. Conversely, if the proper or desired pull-in range is provided for the high frequency channels, the pull-in range at the low frequency channels becomes excessive which can lead to such deleterious effects as locking onto the associated sound carrier, locking onto adjacent channel carriers, and similar problems.

Prior attempts to solve the above-noted and other problems have resulted in added circuitry with attendant added complexity and cost as well as performance deficiencies. Furthermore, prior art techniques have generally lacked flexibility to accomodate diffferent tuner types with the same basic compensation circuit design.

OBJECTS OF THE INVENTION

Accordingly, it is a primary object of this invention to obviate the above-noted and other disadvantages of the prior art.

It is a further object of this invention to provide a voltage controlled radio frequency tuning means and automatic frequency control system with enhanced performance capabilities.

It is a further object of this invention to provide a signal combining circuit for combining a tuning voltage and an AFC voltage.

It is a further object of this invention to provide a signal combining circuit for combining a tuning bias voltage and an AFC error voltage to provide a relatively constant AFC pull-in range for a voltage controlled radio frequency tuner.

It is a yet further object of this invention to provide a signal combining circuit for combining a tuning bias voltage with an AFC error voltage which compensates for non-linearities of a voltage controlled radio frequency tuner.

SUMMARY OF THE INVENTION

In one aspect of this invention the above and other objects and advantages are achieved in a television receiver having a voltage controlled radio frequency tuning means, bias means for providing one of a plurality of bias voltages each of which correspond to a particular television channel to be received, automatic frequency control means for providing an error voltage, and a signal combining circuit.

In one aspect of this invention the signal combining circuit includes first, second, and third resistance means. The first resistance means connects the bias means to an input of the tuning means for coupling the bias voltage to the input. The second resistance means connects the automatic frequency control means to the input of the tuning means for coupling a predetermined portion of the error voltage to the input. The third resistance means is connected in parallel with the second resistance means for coupling a portion of the error voltage to the input of the tuning means which portion increases with the bias voltage provided by the bias means beyond a predetermined bias voltage.

In another aspect of this invention the signal combining circuit includes first resistance means and non-linear second resistance means. The first resistance means connects the bias means to an input of the tuning means for coupling the bias voltage to the input. The non-linear second resistance means connects the automatic frequency control means to the input of the tuning means for coupling a predetermined portion of the error voltage to the input over a first frequency range below a predetermined frequency and an increasing portion of the error voltage to the input over a second frequency range above the predetermined frequency.

DETAILED DESCRIPTION OF THE PREFERRED EMBODIMENT

For a better understanding of the present invention, together with other and further objects, advantages and capabilities thereof, reference is made to the following disclosure in conjunction with the accompanying drawings. While the invention will be described in connection with a UHF tuner in a television receiver, those skilled in the art will realize that the invention is not so limited. Specifically, those skilled in the art will realize that the invention can be applied to a VHF tuner to compensate for non-linearities over the VHF band or bands in a manner similar to that described herein.

Figure 1:
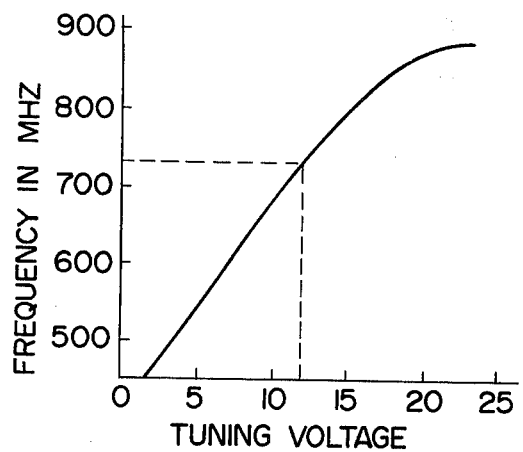
FIG. 1 is a plot of frequency versus tuning voltage for a typical voltage controlled tuner.

FIG. 1 is a plot of the frequency in MHz versus tuning voltage for a typcial UHF voltage controlled radio frequency (RF) tuner of the type using varactor diodes as voltage dependent reactances. The plot of FIG. 1 covers the channel assignments for channels 14 through 83. For the particular UHF tuner to which the curve of FIG. 1 relates, the change in frequency for a given change in tuning voltages is relatively linear for tuning voltages less than about 12 volts. A tuning voltage of 12 volts corresponds to approximately 730 MHz or the frequency of channel 57. Above this frequency or tuning voltage, the characteristic becomes increasingly non-linear such that in the vicinity of channel 83, a relatively large change in tuning voltage corresponds to a small change in frequency.

Figure 2:
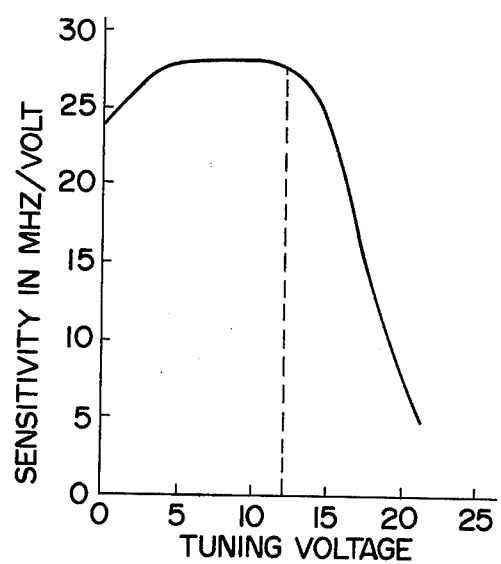
FIG. 2 is a plot of sensitivity versus tuning voltage for a typcial voltage controlled tuner.

The non-linearity of the tuner is further illustrated in FIG. 2 which is a plot of sensitivity in MHz/volt versus tuning voltage as measured for a typical voltage controlled RF tuner. As is illustrated therein, the sensitivity is relatively constant for tuning voltages less than about 12 volts with a slight decrease in sensitivity for tuning voltages below about 5 volts. The most serious non-linearity, however, is for tuning voltages above 12 volts. The sensitivity of the tuner rapidly decreases to relatively low sensitivity for high frequency channels. As was indicated above, due to the lower sensitivity at high frequency channels, the tuner has a much larger frequency change with a given AFC correction voltage at low frequencies than it has at high frequencies. This variation in sensitivity to the correction voltage of the AFC circuit results in substantially different pull-in ranges at the low and high frequency channels.

Figure 3:
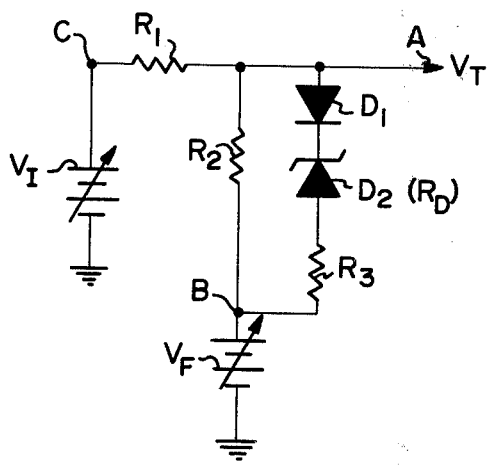
FIG. 3 is a schematic illustration of a circuit embodying the invention.

The basic principles of the invention are illustrated in the schematic diagram of FIG. 3. A bias means or tuning voltage source illustrated as a variable battery $V_I$ is connected between a common conductor illustrated as circuit ground and a point C. A resistance means illustrated as a resistor $R_1$ is connected between point C and a point A which corresponds to an input of a voltage controlled RF tuning means. An AFC means, illustrated as a variable battery $V_F$ is connected between circuit ground and a point B. Point B is connected to point A by a resistance means illustrated as a resistor $R_2$. Another resistance means, illustrated as a resistor $R_3$ connected in series with a threshold device or zener diode $D_2$ and a diode $D_1$, is connected in parallel with resistor $R_2$ between points A and B. The resistance means including zener diode $D_2$ has a non-linear characteristic. Accordingly, diodes $D_1$ and $D_2$ together with resistors $R_2$ and $R_3$ comprise a non-linear resistance means.

In operation, tuning voltage source $V_I$ is adjusted to provide the proper bias voltage for the particular television channel to be received. This bias voltage is coupled via resistor $R_1$ to the input of the tuning means. Slight discrepancies in the proper tuning point, component drift, bias voltage changes and the like may, however, cause the tuner to provide an intermediate frequency (IF) signal which deviates slightly from the desired frequency. Such frequency deviations are detected by an AFC circuit which provides an error voltage, $V_F$, indicative of the frequency deviation. This voltage is coupled through resistor $R_2$ to point A to correct the voltage at point A.

The voltage $V_T$ applied to the input of the tuner at terminal A is given by:

$$V_T = V_I R_E/(R_1 + R_E) + V_F R_1/(R_1 + R_E), \quad (1)$$

where $R_E$ is the equivalent resistance of diodes $D_1$ and $D_2$ and resistors $R_2$ and $R_3$. For practical systems $R_E$ is always much greater than $R_1$ so that equation (1) can be approximated by:

$$V_T = V_I + V_F R_1/R_E. \quad (2)$$

The second term in equation (2) represents the AFC correction voltage, $V_C$, which is a portion of the AFC error voltage, $V_F$.

The equivalent resistance $R_E$ is given by:

$$R_E = R_2(R_3 + R_D)/(R_2 + R_3 + R_D), \quad (3)$$

where $R_D$ is a dynamic resistance of zener diode $D_2$.

When the bias voltage from tuning voltage source $V_I$, less the forward voltage drop of diode $D_1$ and the AFC voltage $V_F$, is less than the threshold or breakdown voltage, $V_Z$, of zener diode $V_2$, that is:

$$V_I - V_{D1} - V_F < V_Z, \quad (4)$$

where $V_{D1}$ is a forward voltage drop of diode $D_1$, zener diode $D_2$ is nonconductive or in its nonconducting state. Accordingly, the dynamic resistance of zener diode $D_2$ is very high. Under these conditions the equivalent resistance, $R_E$, is approximately equal to the resistance of resistor $R_2$. Accordingly, the voltage applied to the tuner, $V_T$, given by equation (2) reduces to:

$$V_T = V_I + V_F R_1/R_2. \quad (5)$$

Since the ratio of $R_1$ to $R_2$ is constant, the AFC correction voltage, $V_C$, is also constant and a fixed or predetermined portion of the AFC error voltage, $V_F$.

If the voltage provided by tuning voltage source $V_I$ is increased for reception of a high frequency television signal and the following condition applies:

$$V_I - V_{D1} - V_F > V_Z, \quad (6)$$

the voltage across zener diode $D_2$ will exceed its threshold or breakdown voltage and zener diode $D_2$ will become conductive. Resistor $R_3$ controls the amount of current flowing through zener diode $D_2$ for any given tuning voltage and thus controls the dynamic resistance, $R_D$, of zener diode $D_2$. Accordingly, equations (2) and (3) give the AFC correction voltage, $V_C$, and the tuning voltage, $V_T$.

Figure 4:
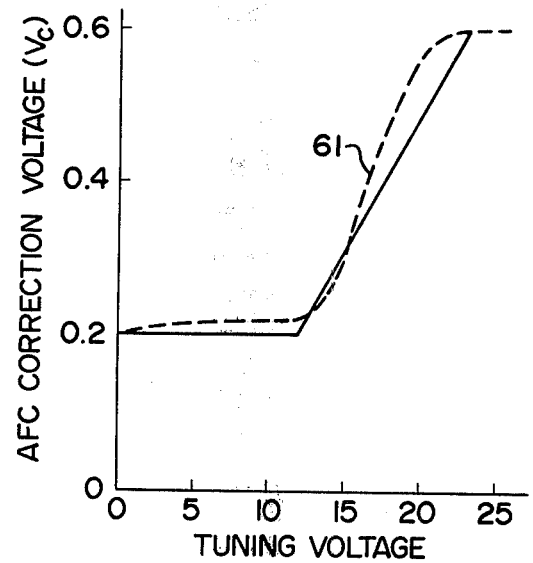
FIG. 4 is a plot of AFC correction voltage versus tuning voltage to aid in explaining the operation of the invention.

FIG. 4 is a plot of the desired AFC correction voltage, $V_C$, versus tuning voltage for a tuner that corresponds to the curves of FIGS. 1 and 2. In FIG. 4 the portion of the curve below 12 volts corresponds to the operating condition where zener diode $D_2$ is not conducting so that the AFC correction voltage, $V_C$, is a substantially constant portion of the error voltage. Since, for the particular tuner chosen for the example, compensation is desired for tuning voltages above 12 volts, zener diode $D_2$ is selected to start conducting when $V_t$ is approximately 12 volts. For tuning voltages greater than 12 volts, the current through zener diode $D_2$ increases with increasing tuning voltage so that the dynamic resistance thereof decreases. The net effect is a decrease of the equivalent resistance, $R_E$, so that an increasing portion of the error voltage, $V_F$, is coupled to point A. This operation is illustrated by the generally linearly increasing portion of the solid line curve of FIG. 4.

In summary, the ratio of $R_1$ to $R_2$ determines the AFC correction voltage, that is, the predetermined portion of the AFC error voltage coupled to point A during reception of lower frequency television signals. The threshold voltage of zener diode $D_2$ determines the threshold tuning voltage or frequency at which compensation begins. The magnitude of resistor $R_3$ and the dynamic resistance, $R_D$, of zener diode $D_2$ determine the amount of compensation at various tuning voltages or frequencies, that is, the slope of the solid line curve of FIG. 4. As a practical matter, the dynamic resistance, $R_D$, of zener diode $D_2$ will become very small at high tuning voltages so that the values of resistors $R_1$, $R_2$, and $R_3$ will determine the maximum correction voltage of the AFC system. It should be noted that diode $D_1$ blocks forward conduction by zener diode $D_2$. Such forward conduction may occur at low values of tuning voltage, $V_t$, when the AFC error voltage, $V_F$, is large.

Figure 5:
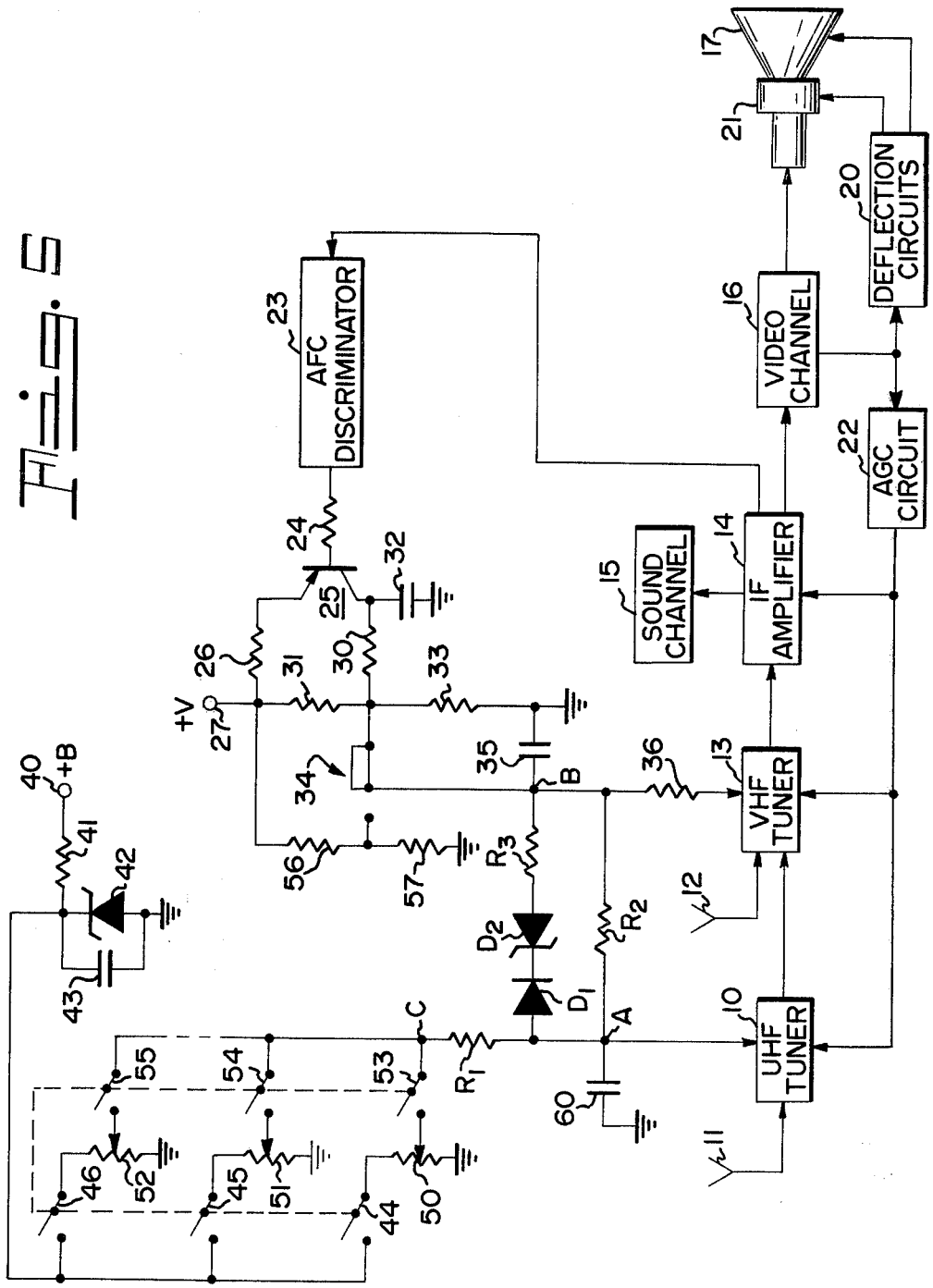
FIG. 5 is a block and schematic illustration of a television receiver incorporating the invention.

FIG. 5 illustrates the invention incorporated in a typical television receiver. The television receiver includes a voltage controlled RF tuning means illustrated as a UHF tuner 10. A signal receiving means illustrated as an antenna 11 couples received television signals to UHF tuner 10. Another signal receiving means illustrated as an antenna 12 couples received television signals to a tuning means illustrated as a VHF tuner 13. An output of UHF tuner 10 is connected to VHF tuner 13 in accordance with the usual practice wherein the VHF tuner operates as an IF amplifier for UHF reception. An output of VHF tuner 13 is connected to an IF amplifier 14 which provides the sound portion of the received signal to a sound channel 15 and the video portion to a video channel 16.

Video channel 16 includes luminance circuitry, and in the case of a color television receiver, chrominance circuitry. Video channel 16 provides one or more signals to a display device illustrated as a cathode ray tube (CRT) 17. At least the synchronizing pulse portion of the received video signal is coupled to deflection circuit 20 which provides the usual vertical and horizontal deflection signals to a deflection yoke 21 associated with CRT 17. The high voltages necessary for the operation of CRT 17 are also derived from deflection circuit 20. A signal representative of the magnitude of the received television signals, such as the synchronizing pulses, is coupled to an AGC circuit 22 which provides the usual AGC signals to UHF tuner 10, VHF tuner 13, and IF amplifier 14.

The IF carrier is coupled from IF amplifier 14 to an AFC discriminator 23 in the usual manner. AFC discriminator 23 provides a signal indicative of the deviation of the IF carrier frequency from the desired IF carrier frequency. This signal, which is generally a voltage level, is coupled via a resistor 24 to a base of a PNP transistor 25. Transistor 25 has an emitter connected by a resistor 26 to a source of energizing potential illustrated as a terminal 27. A collector of transistor 25 is connected by a resistor 30 in series with a resistor 31 to source 27. A capacitor 32 for filtering AC signals is connected from the collector of transistor 25 to circuit ground. A resistor 33 is connected from the junction of resistors 30 and 31 to circuit ground. The junction of resistors 30, 31, and 33 is connected by a switch 34 to a point B which corresponds to point B of FIG. 3. Point B is connected by a filter capacitor 35 to circuit ground. Accordingly, components numbered from 23 to 35 correspond to AFC means $V_F$ of FIG. 3 and provide an error voltage, $V_F$, at point B.

Point B is connected by a resistor 36 to an AFC input of VHF tuner 13. VHF tuner 13 can be a voltage controlled radio frequency tuning means in which case resistor 36 can be replaced by a signal combining circuit in accordance with the invention described herein to provide compensation in a manner similar to that described in connection with UHF tuner 10.

A source of energizing potential illustrated as a terminal 40 is connected by a resistor 41 in series with a zener diode 42 to circuit ground. Zener diode 42 is preferably a temperature compensated zener diode to provide a relatively stable regulated voltage which does not vary substantially with temperature. A filter capacitor 43 is connected in parallel with zener diode 42. The junction of resistor 41 and zener diode 42 is connected to one contact of each of a plurality of switches 44–46. The other contact of each of switches 44–46 is connected by a respective resistance element of potentiometers 50–52 to circuit ground. The taps of potentiometers 50–52 are connected by respective ones of switches 53–55 to point C which corresponds to point C in FIG. 3. Accordingly, components numbered from 40 through 55 comprise a bias means which corresponds to tuning voltage source $V_t$ of FIG. 3.

Switches 44–46 and 53–55 are part of the channel selection circuitry and are ganged so that only one pair of switches is closed at any one time to connect only one of potentiometers 50–52 in the circuit. Potentiometers 50–52 are adjustable so that each potentiometer can be adjusted to provide the tuning voltage for any one of the UHF television channels. While three potentiometers and pairs of switches are illustrated, in practice the number of potentiometers and pairs of switches can be any number desired. Accordingly, the bias means provides one of a plurality of bias voltages each of which correspond to a particular television channel to be received. The particular bias voltages are determined by the settings of the potentiometers 50–52 with the particular one of the bias voltages being determined by closure of one pair of the switches.

A pair of series connected resistors 56 and 57 are connected between source 27 and circuit ground with the junction therebetween connected to a terminal of switch 34. When potentiometers 50–52 are being adjusted, switch 34 connects the junction of resistors 56 and 57 to point B so that the AFC error voltage does not affect adjustment of the potentiometers.

Points B and C are connected to point A by resistors $R_1$, $R_2$, and $R_3$ and diodes $D_1$ and $D_2$ with the same circuit arrangement as in FIG. 3. Point A is connected to the tuning voltage input of UHF tuner 10. Point A is also connected by a filter capacitor 60 to circuit ground. The operation of the invention in FIG. 5 is the same as that described for FIG. 3.

In one practical circuit arrangement dashed line curve 61 of FIG. 4 was obtained. Dashed line curve 61 corresponds to the theoretical solid line curve with only minor deviations. It should be noted, however, that even closer correspondence may be obtained with other dynamic resistance means substituted for the circuit between points A and B. Such other dynamic resistance can include voltage variable resistors, field-effect transistors, and/or other circuit components. Accordingly, there has been shown and described a signal combining circuit for combining an error voltage from an AFC means with a bias voltage from a tuning bias means in a manner such that the AFC system has a relatively constant pull-in range despite non-linearities of a voltage controlled RF tuning means.

While there has been shown and described what is at present considered the preferred embodiment of the invention it will be obvious to those skilled in the art that various changes and modifications may be made therein without departing from the invention as defined by the appended claims.

I claim:

1. In a television receiver having a voltage controlled radio frequency tuning means, bias means for providing one of a plurality of bias voltages each of which correspond to a particular television channel to be received, and automatic frequency control means for providing an error voltage, a signal combining circuit comprising:
   first resistance means connecting said bias means to an input of said tuning means for coupling the bias voltage to said input;
   second resistance means connecting said automatic frequency control means to said input of said tuning means for coupling a predetermined portion of the error voltage to said input; and
   third resistance means connected in parallel with said second resistance means, said third resistance means including a threshold device which is nonconductive for bias voltages below a predetermined threshold and which has a dynamic resistance characteristic for bias voltages above said predetermined threshold, for coupling a portion of the error voltage to said input which portion increases with the bias voltage provided by said bias means beyond said predetermined bias voltage.

2. A signal combining circuit as defined in claim 1 wherein said threshold device is a zener diode and said third resistance means includes a resistor in series therewith.

3. A signal combining circuit as defined in claim 2 wherein said first and second resistance means are each resistors.

4. A signal combining circuit as defined in claim 3 wherein said third resistance means includes a diode in series with said zener diode for preventing forward conduction thereof.

5. In a television receiver having a voltage controlled radio frequency tuning means, bias means for providing one of a plurality of bias voltages each of which correspond to a particular television channel to be received, and automatic frequency control means for providing an error voltage, a signal combining circuit comprising:
   first resistance means connecting said bias means to an input of said tuning means for coupling the bias voltage to said input; and
   non-linear second resistance means connecting said automatic frequency control means to said input of said tuning means, said non-linear second resistance means including a first resistor for coupling a predetermined portion of said error voltage to said input over a first frequency range below a predetermined frequency and third resistance means connected in parallel with said first resistor for coupling an increasing portion of said error voltage to said input over a second frequency range above said predetermined frequency, said third resistance means including a zener diode which is nonconductive over said first frequency range and a second resistor in series therewith.

6. A signal combining circuit as defined in claim 5 wherein said first resistance means is a resistor and said third resistance means includes a diode in series with said zener diode for preventing forward conduction thereof.

* * * * *